United States Patent [19]

Tang et al.

[11] Patent Number: 5,751,163
[45] Date of Patent: May 12, 1998

[54] PARALLEL PROGRAMMING OF IN-SYSTEM (ISP) PROGRAMMABLE DEVICES USING AN AUTOMATIC TESTER

[75] Inventors: Howard Tang; Daniel V. Parker, both of San Jose, Calif.

[73] Assignee: Lattice Semiconductor Corporation, Hillsboro, Oreg.

[21] Appl. No.: 632,811

[22] Filed: Apr. 16, 1996

[51] Int. Cl.$^6$ .................................................. H03K 19/177
[52] U.S. Cl. .......................... 326/38; 326/41; 324/158.1
[58] Field of Search ................................. 326/38–41, 47; 324/158.1; 321/22.1, 22.4

[56] References Cited

U.S. PATENT DOCUMENTS

| | | | |
|---|---|---|---|
| 5,237,219 | 8/1993 | Cliff | 326/38 X |
| 5,457,408 | 10/1995 | Leung | 326/39 X |
| 5,493,239 | 2/1996 | Zlotnick | 326/38 |
| 5,528,600 | 6/1996 | El Ayat et al. | 324/158.1 X |
| 5,543,730 | 8/1996 | Cliff et al. | 326/39 X |

OTHER PUBLICATIONS

"Lattice In–System Programmability Manual 1994", Lattice Semiconductor Corporation.

*Primary Examiner*—David R. Hudspeth
*Attorney, Agent, or Firm*—Skjerven, Morrill, MacPherson, Franklin & Friel; Edward C. Kwok

[57] ABSTRACT

An automatic tester is provided to simultaneously program PLDs organized in device chains, so as to minimize programming time and to maximize utilization of the tester pins. Various configurations which allow parallel programming of device chains are provided for device chains using the same programming convention, e.g. in-system programming (ISP) convention. Various configuration which allow parallel programming of device chains using different programming conventions, such as BSCAN and ISP conventions, are provided.

7 Claims, 13 Drawing Sheets

```
0000X0X0X
0100X0X0X
0110X0X0X
0100X0X0X
0000X0X0X
0010L0L0L
```

```
0000X0000X0000X
0100X0100X0100X
0110X0110X0110X
0100X0100X0100X
0000X0000X0000X
0010L0010L0010L
0101X0101X0101X
0111X0111X0111X
0101X0101X0101X
0100X0100X0100X
```

PARALLEL PROGRAMMING OF IN-SYSTEM (ISP) PROGRAMMABLE DEVICES USING AN AUTOMATIC TESTER

BACKGROUND OF THE INVENTION

1. Field of the Invention

The present invention relates to programmable logic devices and programming such devices using an automatic test equipment (ATE) or tester. In particular, the present invention relates to configuring an ATE and configuring multiple programmable logic devices (PLD) into device chains for parallel programming.

2. Discussion of the Related Art

In-system programming devices, which are PLDs that can be field programmed, are extremely flexible devices because they can be programmed in their operating environment, without requiring removal to a programmer. In-system programming (ISP) is disclosed, for example, in U.S. Pat. No. 5,237,218, entitled "Structure and Method for Multiplexing Pins for In-system Programming", to G. Josephson et al, Ser. No. 695,356, filed May 3, 1991 and issued Aug. 17, 1993. In one instance of an in-system programmable device, in-system programming is achieved by providing the PLD with an internal state machine and a five-pin programming interface: ISPEN, Mode, SCLK, SDI and SDO pins. The ISPEN (ISP enable) pin is used to place the PLD into in-system programming mode. During in-system programming, a clock signal is provided on the SCLK pin, and in-system control bits for controlling the internal state machine for programming are provided to the PLD via the Mode pin. The SDI and SDO pins are a serial input pin and a serial output pin, respectively, for shifting programming commands and data into the PLD. Typically, in-system programming of multiple PLDs can be achieved by daisy-chaining a number of in-system programmable PLD, SDO to SDI, using commonly connected ISPEN, mode and SCLK pins. Because ISP mode is entered when the signal on the ISPEN pin is asserted, the Mode pin, SCLK pin, the SDI pin and the SDO pins are sometimes multiplexed for other purposes when not in ISP mode.

Recently, programming of PLDs are also achieved using an automatic tester, so as to achieve the advantages of programming, verifying the programming, and testing of the PLDs on a single piece of equipment and within the operating environment of the system these PLDs are deployed. Programming of PLDs using an automatic tester is disclosed, for example, in U.S. Pat. No. 5,635,855, issued on Jun. 30, 1997, entitled "Method for Programming of In-system Programmable Integrated Circuits," by Howard Tang, assigned to Lattice Semiconductor Corporation, which is also the Assignee of the present Application.

In the prior art, the size of a vector file used in an ATE to program PLDs in a conventional ISP programming configuration is often limited by addressable size of the test vector memory of the ATE, since many testers are provided such that each memory location stores a test vector. For example, if the ATE test vector memory is addressed by an 16-bit address bus, the maximum number of vectors is limited to 64K[1]. Thus, for large configurations of PLDs, the size of the vector file can become too large to be held in the ATE tester. Vector files are thus often split into several smaller files, which are loaded into the tester one file at a time, so that the total programming time is the sum of the individual programming time of each file. In manufacturing, a high throughput is a desirable goal. Thus, it is desirable to program and test a large number of PLDs simultaneously on a single tester, minimizing the total time required for such operations, and without the requirement of loading multiple files.

[1] one "K" is 1024.

SUMMARY OF THE INVENTION

The present invention provides a method for programming in parallel programmable logic devices (PLDs), using an automatic tester (ATE) of multiple pins. The present invention is applicable to PLDs of any one of various programming conventions, such as "in-system programming" or "boundary scan". Typically, such a programmable logic device would include one or more control pins (e.g. ISPEN, Mode, SCLK), a serial input pin and a serial output pin.

According to the method of the present invention, in a first embodiment, two or more device chains, each including one or more serially or daisy-chained connected PLDs, are connected for programming by the by the ATE. In one embodiment, the control pins of both device chains are tied together and connected to a single pin of the ATE. The input pin of each device chain is assigned an ATE pin for data input. Programming of the device chains is achieved by shifting programming instructions and data into the PLDs of each device chain via the input pin of each device chain, and simultaneously activating the programming mechanisms in each PLD. Since the control pins of both device chains are coupled to the same ATE pins, the control mechanisms in each of the device chain are substantially.

In accordance with one aspect of the present invention, the output pin of one device chain is coupled to the input pin of the other device chain by a resistor. By this resistor, conventional daisy chain programming of both device chains can be achieved through the input pin of the first device chain.

In a second embodiment of the present invention, two device chains are provided in substantially the same manner as in the first embodiment, except that the control pin or pins of each device chain are separately coupled to ATE pins. Since the control pins of each device chain are each separately coupled to an ATE pin, the control mechanisms in these device chains can be dissimilar. In fact, the present invention allows parallel programming for device chains controlled by different internal state machines, such as those of the ISP and BCAN ("boundary scan") programming conventions.

In a third embodiment of the present invention, device chains configured in the manner of the first embodiment, and device chains configured in the manner of the second embodiment can be provided at the same time. In accordance with one aspect of the present invention, a resistor can be provided to couple an output pin of one device chain and an input pin of another device chain. Using this resistor, conventional daisy-chain programming can be achieved.

The present invention allows shortening of vector files and hence programming time by splitting up long programming daisy chains into separate device chains which can be programmed simultaneously or in parallel.

The present invention is better understood upon consideration of the detailed description below and the accompanying drawings.

BRIEF DESCRIPTION OF THE DRAWINGS

FIG. 1a shows an embodiment of the present invention in system 100, in which the ATE pins driving the ISP terminals of PLDs are arranged in a "2-pin ATE setup".

FIG. 1b shows an example of a vector file used for parallel programming of system 100 of FIG. 1a.

FIG. 2A shows an embodiment of the present invention in system 200, in which the ATE pins driving the ISP terminals of PLDs are arranged in a "5-pin ATE setup".

FIG. 2b shows an example of a vector file used for parallel programming of system 100 of FIG. 1a.

FIG. 5a shows a system 500 including PLDs 501–502 in a 5-pin ATE setup and PLDs 503–504 in a 2-pin ATE setup, in accordance with the present invention.

FIG. 5b shows an example of a vector file used for parallel programming of system 500 of FIG. 5a.

DETAILED DESCRIPTION OF THE PREFERRED EMBODIMENTS

The present invention provides a method for programming multiple programmable logic devices (PLDs) in parallel, using an automatic test equipment (ATE), such as a tester. One embodiment of the present invention, which is illustrated by system 100 in FIG. 1a, allows both conventional ISP programming and parallel programming in accordance with the present invention.

Figures 1A, 1B:
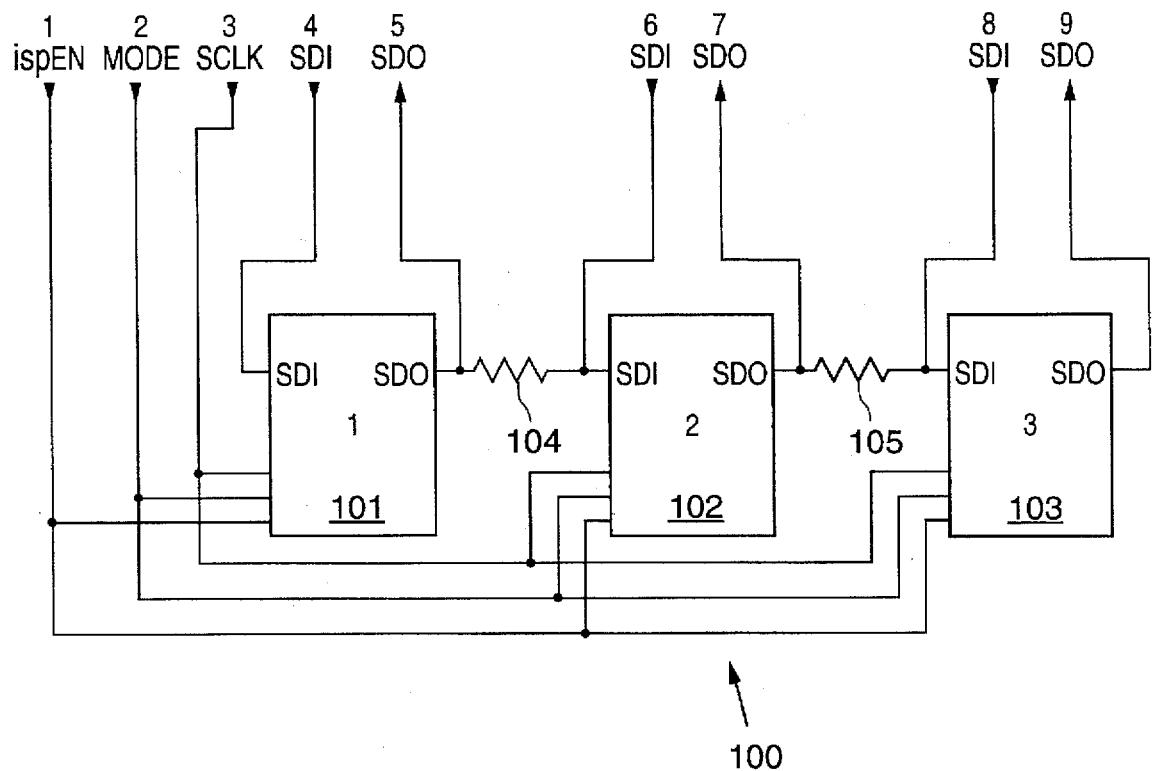

As shown in FIG. 1a, system 100 includes daisy-chained PLDs 101, 102 and 103. In this configuration, the serial data output (SDO) terminal of PLD 101 is coupled to the serial data input (SDI) terminal of PLD 102 through resistor 104. Likewise, the SDO terminal of PLD 102 is coupled to the SDI terminal of PLD 103 through resistor 105. The respective in-system programming enable (ISPEN) pin, the Mode pin and the scan clock (SCLK) pin of PLDs 101–103 are commonly connected. To allow programming by an ATE, the ISPEN pin, the Mode Pin, the SCLK pin are connected respectively to the output pins 1–3 of an ATE. Further, as shown in FIG. 1a, the SDI and the SDO pins of PLD 101–103 are respectively connected to pins 4–5, 6–7 and 8–9. In this configuration, with ATE pins 6 and 8 at high impedance, system 100 can be programmed using a conventional daisy-chain ISP technique. Of course, this configuration allows conventional ISP programming using a conventional programmer as well. Alternatively, parallel programming can be achieved by supplying data and instructions to PLDs 102 and 103 through ATE pins 6 and 8, with the programming of all three devices controlled by the ISPEN, Mode and SCLK pins, which are driven by ATE pins 1–3. In system 100, the state machines of PLDs 101–103 must be controlled substantially identically. Conventional ISP and parallel programming modes are possible because, while resistors 104 and 105 isolate the SDI terminals of PLDs 102 and 103 from the SDO terminals of PLDs 101 and 102, when ATE pins 6 and 8 each assert a logic signal. Resistors 104 and 105 couple the logic values at the SDO terminals of PLDs 101 and 102 to the SDI terminals of PLDs 102 and 103, when ATE pins 6 and 8 are at high impedance. FIG. 1b shows an example of a vector file for use with system 100. In FIG. 1b, the binary data on each line correspond to the excitation at ATE pins 1–9 during one clock period of the scan clock (SCLK) for parallel programming of the PLDs. In the notation of FIG. 1b, besides the logic values "1" and "0", the logic value "don't care" is indicated by an "X", and high voltage and low voltages, typically applied to the SDO pin during ISP programming, are indicated by "H" and "L" respectively. Clearly, there is no limit as to how many PLDs can be configured, according to the configuration of FIG. 1a, for daisy-chained conventional ISP programming or parallel programming of the present invention. For each PLD included in the configuration of FIG. 1a, two additions ATE pins are required for coupling the SDI and SDO terminals of the added PLD. For this reason, the basic configuration of system 100 is referred to as the "2-pin ATE setup".

Figures 2A, 2B:
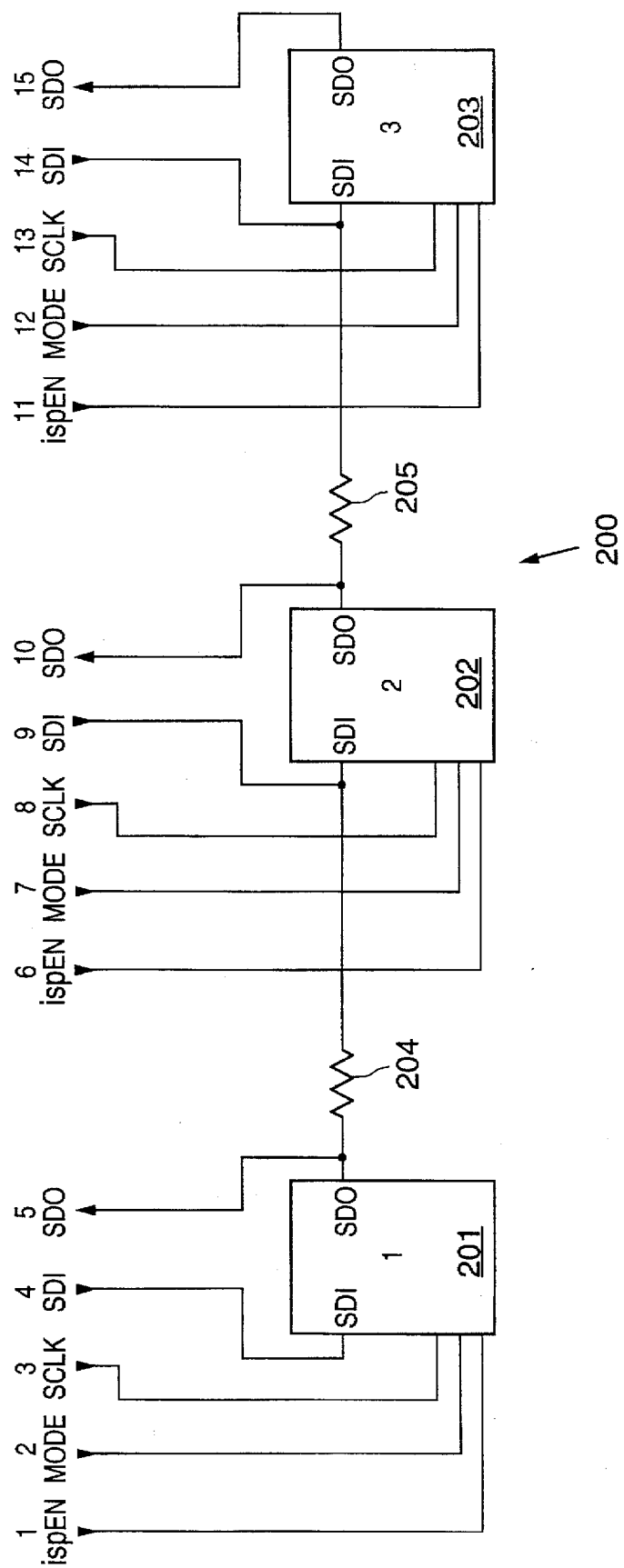

FIG. 2a shows another embodiment of the present invention in system 200, which includes PLDs 201–203 configured such that ISP terminals (i.e. ISPEN, Mode, SCLK, SDI and SDO pin) are driven by a separate ATE pin. As shown in FIG. 2a, the ISP control pins of PLDs 201–203 are driven respectively by ATE pins 1–3, 6–8 and 11–13. In this configuration, because each PLD receives its own set of ISP control signals, the state machines of PLDs 201–203 can be controlled independently. Conventional ISP programming can also be achieved in system 200 by holding ATE pins 9 and 14 at high impedance and providing identical excitation at ATE pins 1–3, 6–8 and 11–13. However, in this configuration, for each PLD added to the configuration, five additional ATE pins are required. Thus, the configuration of system 200 is referred to as the "5-pin ATE setup". FIG. 2b shows a test vector file for the configuration of system 200. The binary data on each line of test vector file in FIG. 2b corresponds to the excitations of ATE pins 1–15 at a clock period of the SCLK clock, for parallel programming of system 200.

Figures 5A, 5B:
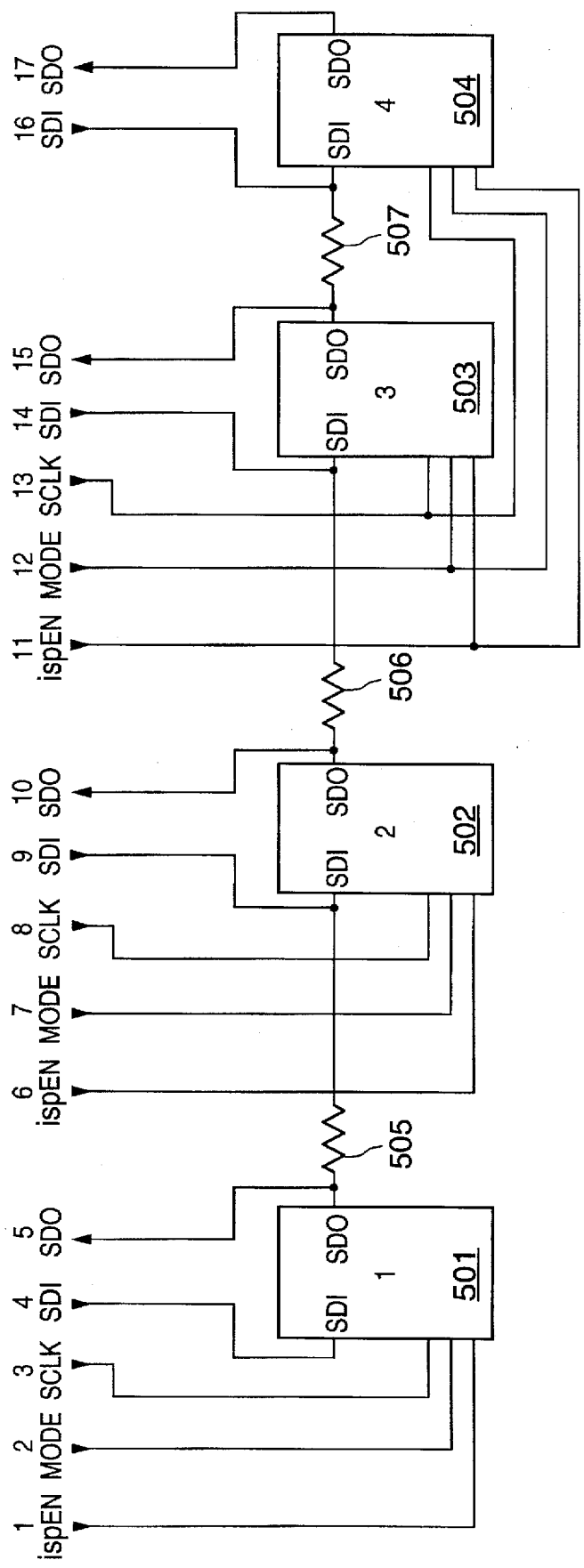

The 2-pin ATE setup and the 5-pin ATE setup can be provided in the same system simultaneously. An example of such a system is shown in system 500 of FIG. 5a. As shown in FIG. 5a, PLDs 501–502 are provided in the 5-pin ATE setup, and PLDs 503–504 are provided in the 2-pin ATE setup. Accordingly, ten ATE pins (1–10) are provided to drive PLDs 501–502, and seven ATE pins (11–18) are provided to drive PLDs 503–504. PLDs 502 and 503 are daisy-chained in the conventional ISP manner by resistor 506, so that conventional ISP programming can be achieved by holding ATE pins 9, 14 and 16 in high impedance and providing identical excitations in the ISP control pins (i.e. ATE pins 1–3, 6–8, 11–13) for PLDs 501–503.

FIG. 5b is an example vector file for parallel programming of system 500, showing the excitation for ATE pins 1–17 for each clock period of the SCLK clock.

Figure 3:
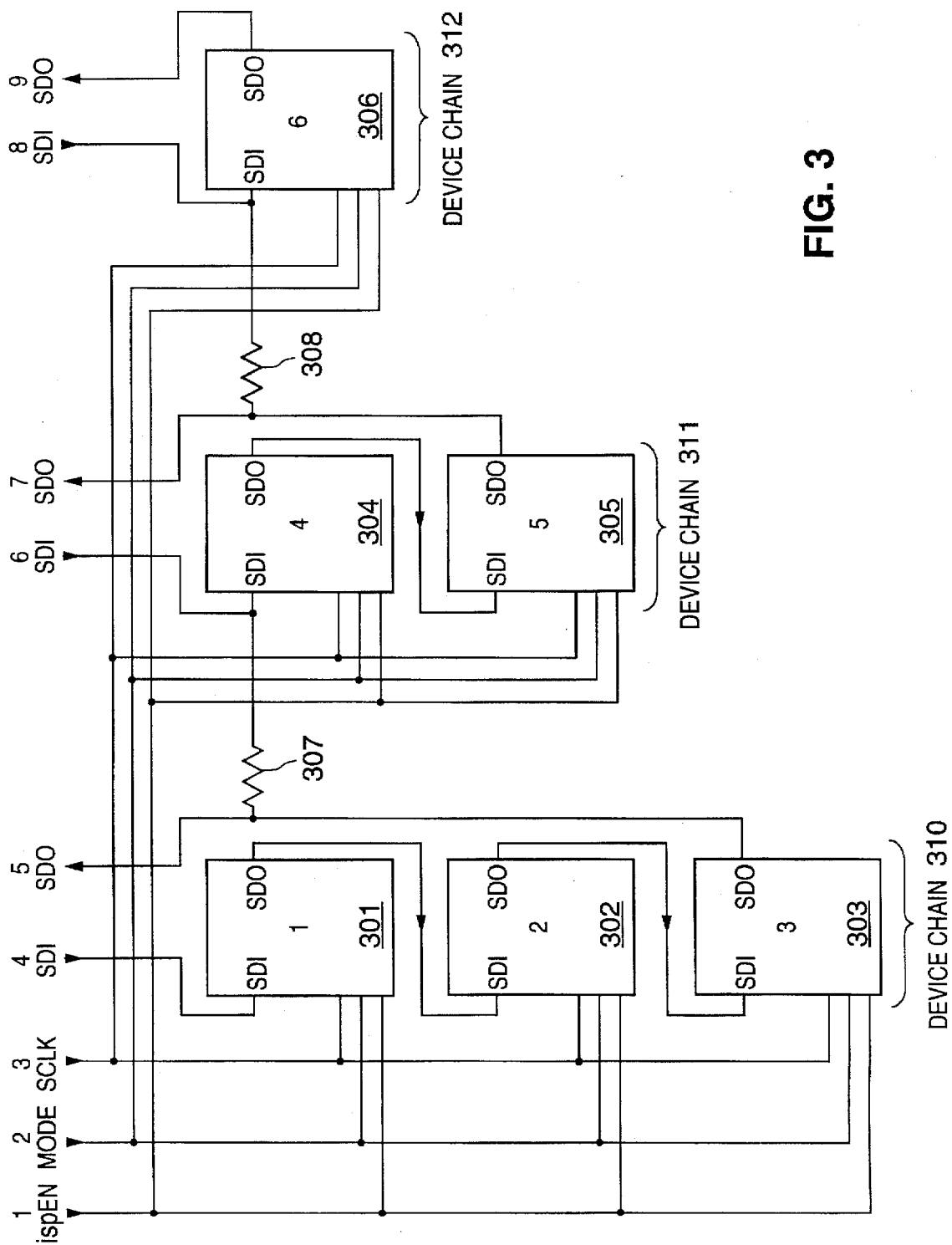
FIG. 3 shows device chains 310–312, each having one or more PLDs connected in a daisy-chain fashion, coupled for a 2-pin ATE setup for parallel programming.

The 2-pin ATE setup and 5-pin ATE setup can also be used with device chains. A device chain is a group of daisy-chained devices configured for conventional ISP programming. An example of a 2-pin ATE setup is shown in system 300 of FIG. 3. As shown in FIG. 3, PLDs 301–303 constitute a device chain 310 and can be programmed using their commonly connected ISP control pins driven by ATE pins 1–3, with instruction and data serially shifted into PLDs 301–303 at the SDI pin of PLD 501, which is driven by ATE pin 4. Similarly, PLDs 304–305 form a second device chain 311, and PLD 306 form a third device chain 312 of a single PLD. Each device chain is provided two ATE pins for driving the SDI pin and for receiving the shifted output data from the SDO pin of the last PLD in the device chain, respectively. The ISP control pins of PLDs 301, 304 and 306 are commonly connected to ATE pins 1–3 in a 2-pin ATE setup, so that device chains 310–312 can be programmed in parallel. Of course, in this configuration, the ISP state machines of PLDs 301–306 are controlled identically.

In system 300, resistors 307 and 308 couple device chain 310 to device chain 311, and device chain 311 to device chain 312. Thus, in conventional ISP programming, (a) ATE pins 1–3 provides programming control to the ISP control pins, (b) ATE pin 4 drives the data and instructions into the SDI terminal of PLD 301, (c) ATE pin 9 receives at the SDO terminal of PLD 306 the serial data shifted out of the daisy-chain of PLDs 301–306, and (d) ATE pins 6 and 8 are held at high impedance.

Figure 4:
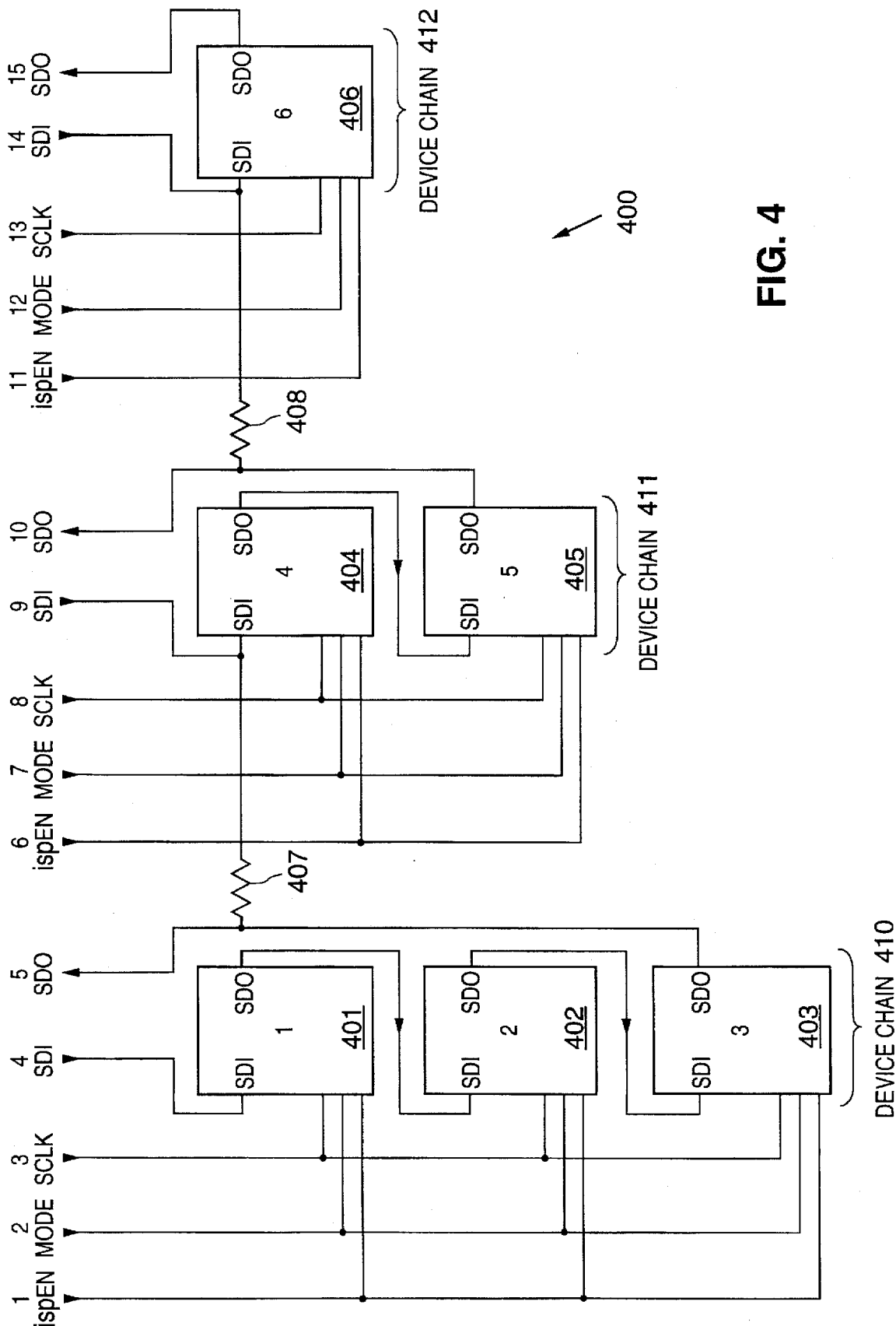
FIG. 4 shows device chains 410–412, each having one or more PLDs connected in a daisy-chain fashion, coupled for a 5-pin ATE setup for parallel programming.

FIG. 4 shows a system 400, including device chains 410–412 (i.e. PLDs 401–403, 404–405 and 406, respectively), coupled for a 5-pin ATE setup for parallel programming. In system 400, unlike device chains 310–312 of FIG. 3, device chains 410–412 can be controlled independently. Of course, conventional ISP programming can be achieved also, by holding ATE pins 9 and 14 at high impedance and driving the corresponding ISP control pins of device chains 410–412, i.e. ATE pins 1–3, 6–7 and 11–13, identically.

From the above description, those skilled in the art would appreciate that parallelism, i.e. adding a device chain (including a single-PLD "chain") in either 2-pin ATE setup or the 5-pin ATE setup, requires additional ATE pins. Additional ATE pins are seen in the vector file as an increased vector file width. However, if a PLD is added to an existing device chain instead, the time required for programming the device chain is increased. Increased programming time is seen in the vector file as an increase in the length or "depth" of the vector file. A longer length vector file requires longer programming time. Typically, an ATE has a large number of tester pins (e.g. exceeding 200 pins) to accommodate a large number of device chains for parallel programming. As discussed above, the depth of the vector file is often limited by the addressable size of the ATE memory, since many testers are provided such that each memory location corresponds to a test vector. In some testers, additional pins may be added by increasing the width of the memory. However, the number of addressable locations, hence the number of test vectors that can be stored in the memory is constrained by the address space. Thus, one advantage of using the 2-pin ATE setup or the 5-pin ATE setup is the minimization of vector file depth. In the present invention, the depth of a vector file is minimized by splitting a long daisy-chain of devices into parallel chains for parallel programming. Each parallel chain, of course, increases the width of the vector file in accordance with whether a 2-pin ATE setup or a 5-pin ATE setup is used.

Figure 6:
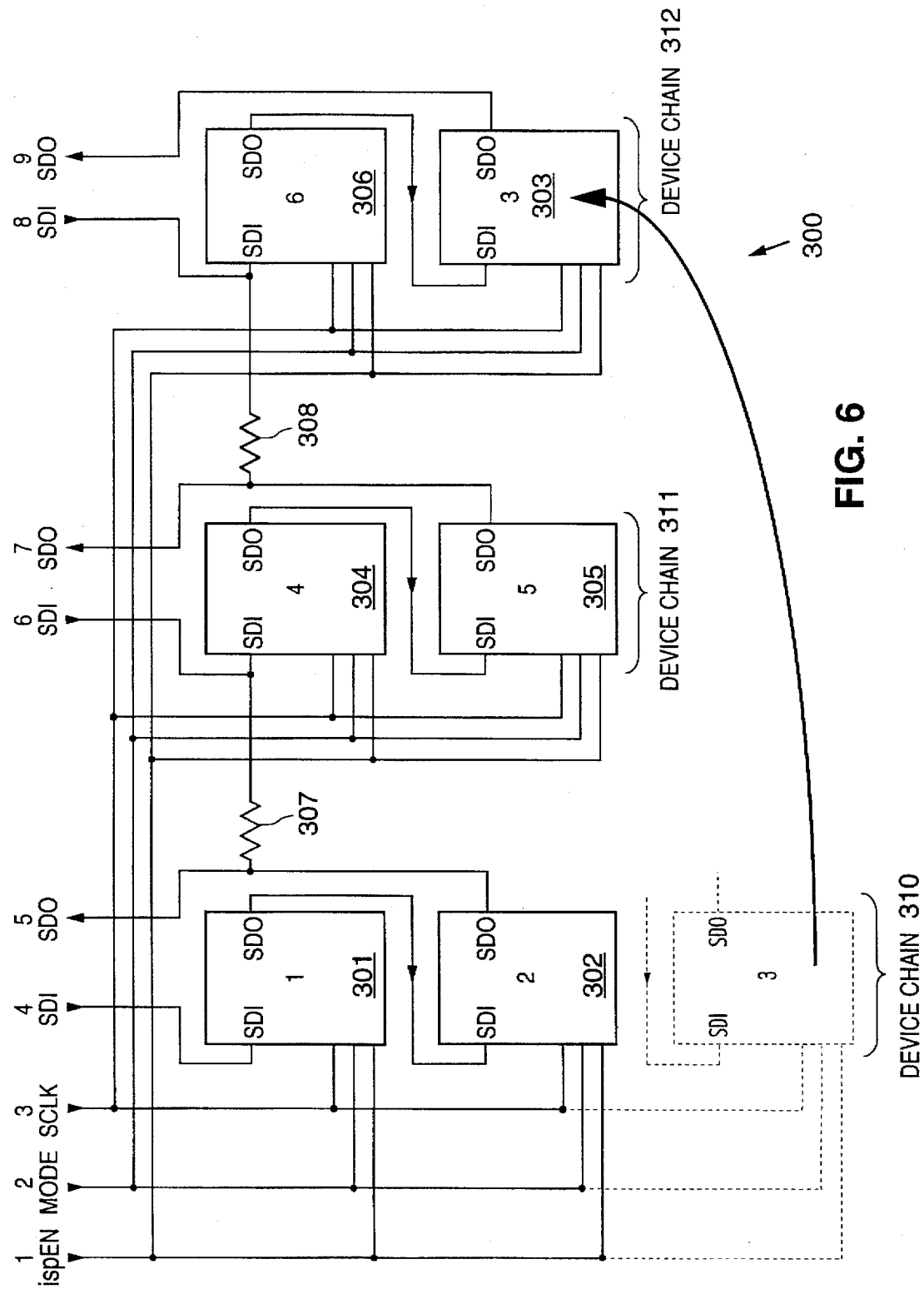
FIG. 6 shows the programming time for system 300 can be reduced further in accordance with the present invention by adjusting the lengths of the device chains.

FIG. 6 shows that the vector file depth can be further reduced by equalizing the lengths of the device chains. FIG. 6 modifies system 300 by moving PLD 303 from device chain 310 to device chain 312. As a result, device chains 310–312 are substantially of the same length and thereby minimizes programming time. Thus, one approach to minimizing programming time according to the present invention is to assign PLDs first as single-pin device chains in a 2-pin ATE setup, a 5-pin ATE setup, or any combination of these setups, until all ATE pins are assigned. Thereafter, a PLD is assigned to each device chain in order, until all PLDs are assigned. In this manner, the longest device chain is at most one PLD longer than the shortest device chain.

Figure 7:
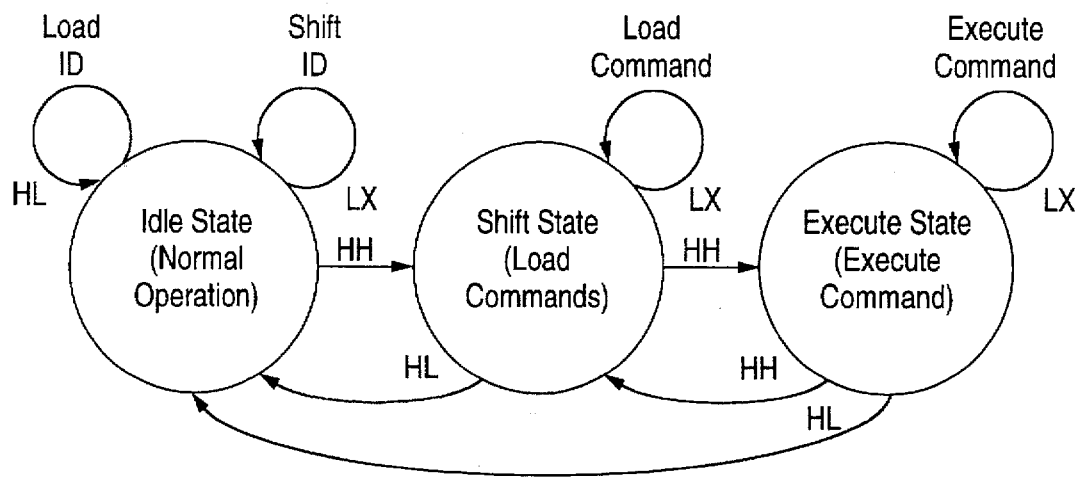
FIG. 7 shows the state machine for controlling programming under the ISP programming conventions.
Figure 8:
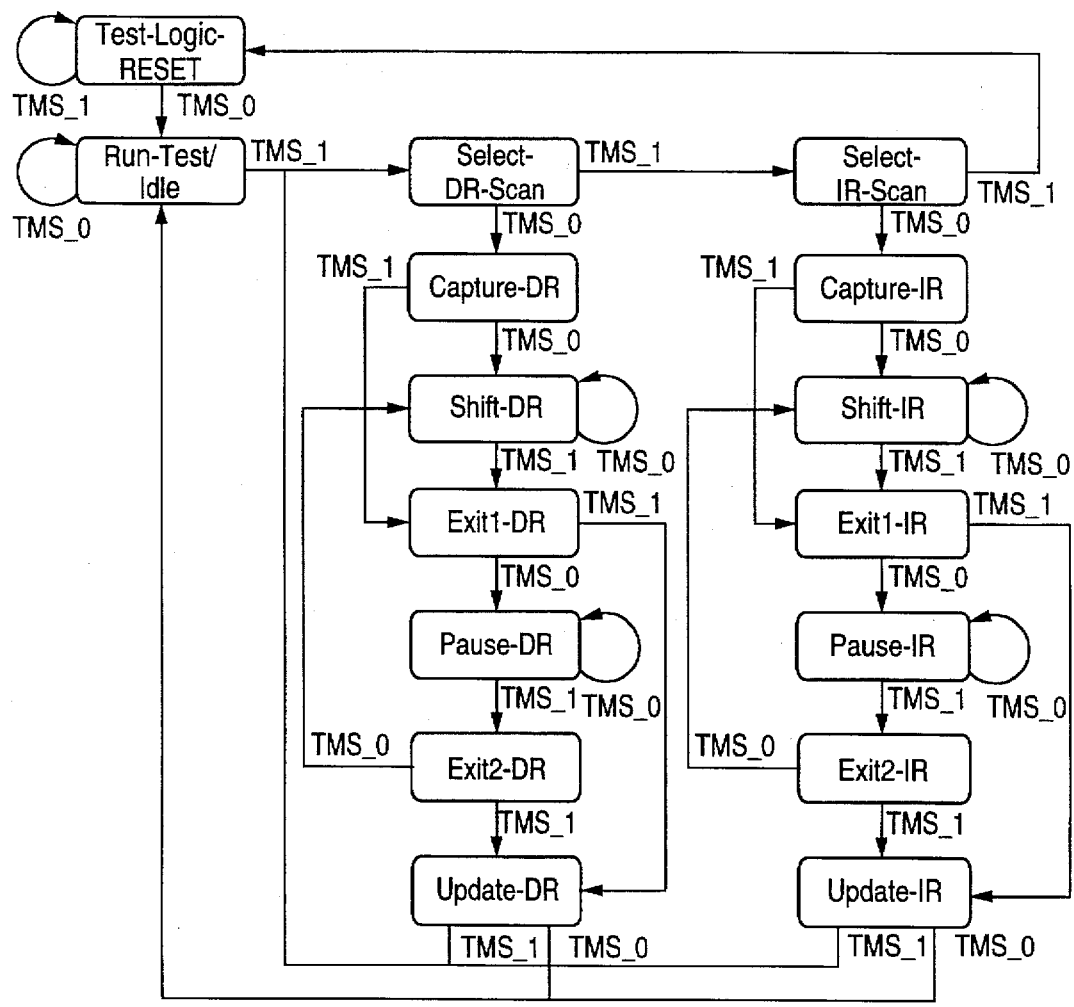
FIG. 8 shows the state machine for controlling programming under the BSCAN programming conventions.
Figure 9:
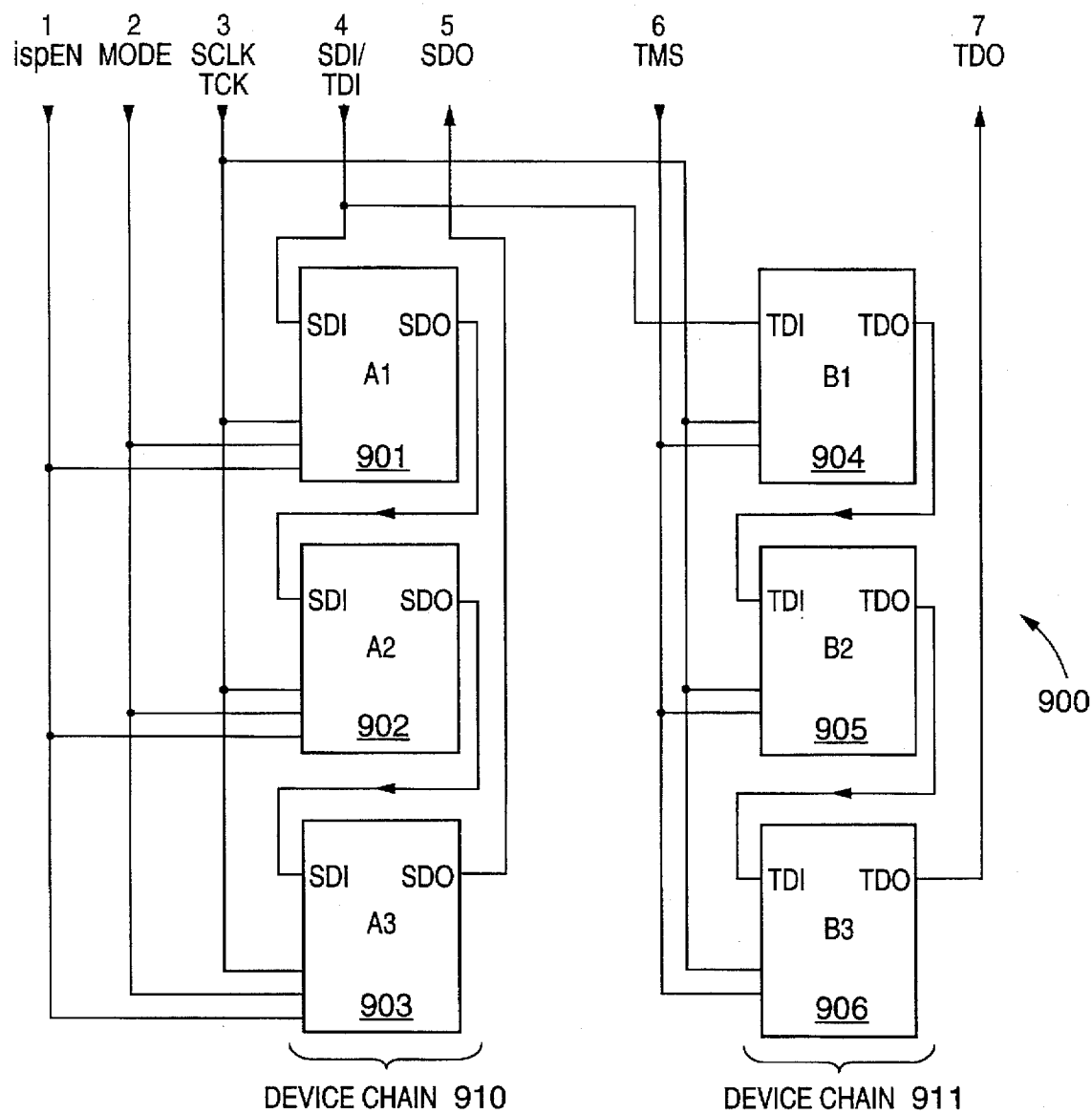
FIG. 9 illustrates further how an ATE tester can be used to program system 900 in a parallel manner, using common clock and input pins for PLDs operating under the ISP and BSCAN programming conventions.

The present invention is also applicable to parallel programming of PLDs that uses different programming control conventions. FIG. 9 illustrates further how an ATE tester can be used to program system 900 in a parallel manner, using common clock and input pins for PLDs operating under the ISP and BSCAN programming conventions. The ISP and the BSCAN programming conventions are known to those skilled in the art. FIGS. 7 and 8 show respectively the state machines for controlling programming under the ISP and the BSCAN programming conventions. Under the BSCAN programming convention, four pins, designated TMS ("test mode select"), TCK ("test clock"), TDI ("test data input") and TDI ("test data output") are provided for the programming operations. As shown in FIG. 9, device chain 910 includes PLDs 901–903 configured in the conventional ISP daisy chain, with the ISP control pins (i.e. ISPEN, Mode, SCLK) driven by ATE pins 1–3 and the SDI pin of PLD 901, the first PLD of device chain 910, driven by ATE pin 4, and the SDO pin of PLD 903, the last PLD in device chain 910 coupled into ATE pin 5. Device chain 911, which is formed by PLDs 904–906, to be programmed under the BSCAN programming convention, is configured such that the TMS pins of PLDs 904–906 are driven by ATE pin 6. The TCK pins of PLDs 904–906 share the clock signal on ATE pin 3, which is also coupled to the SCLK terminals of PLDs 901–903. PLDs 904–906 are connected in device chain 911 in a daisy-chain fashion with the TDI pin of PLD 904, the first PLD of device chain 911, driven by ATE pin 6, and the TDO pin of PLD 906, the last PLD of device chain 910, received into ATE pin 7.

During operation, the ISPEN pins of device chain 910 are driven low by ATE pin 1 to place PLDs 901–903 of device chain 910 in ISP mode. Simultaneously, ATE pin 2 (MODE), ATE pin 3 (SCLK) and ATE 4 (SDI) are used to shift instructions and data into device chain 910. ATE pin 5, i.e. the SDO pin, receives data from device chain 910. During this time, ATE pin 6 (TMS) is set to logic high to device chain 910 in the "Test-Logic RESET" state in which PLDs 904–906 of device chain 911 ignores the input data on ATE pin 4. After the data and programming instruction are completely shifted into device chain 910, ATE pin 2 (MODE) is then held at logic low, so that data and instructions can be shifted into device chain 911 via ATE pin 4 (TDI), using the clock signal on ATE pin 3 (TCK). Data shifted out of device chain 911 is received into ATE pin 6

(TMS). With the MODE pin driven by ATE pin 2 at logic low state, while ISPEN pin remaining at logic low, device chain 910 is kept at the "shift" state in which the data at the SDI pin of device chain 910 is ignored. After data and programming instructions are shifted into device chain 911, the TMS and MODE pins, driven by ATE pins 2 and 6 respectively, in conjunction with the common clock signal on ATE pin 3, put device chain 910 into the "execute" state and device chain 911 into the "Run-Test Idle" state. Consequently, device chain 910 and 911 are simultaneously programmed in accordance with their respective programming conventions.

Verification of the programmed data can be achieved similarly. While ATE pin 6 (TMS) is held at logic high, i.e. device chain 911 is kept at the "Test-Logic RESET" state, ATE pin 2 (MODE), ATE pin 3 (SCLK) and ATE pin 4 (SDI) are used to shift data from PLDs 901–903 in device chain 910 to ATE pin 5 (SDO) for verification. After the programmed data in device chain 910 is verified, ATE pin 2 (MODE) is then held at logic low, i.e. the "shift" state mentioned above, to allow data to be shifted data out of PLDs 904–906 in device chain 911, using ATE pin 3 (TCK), pin 4 (TDI) and pin 6 (TMS).

Figure 10:
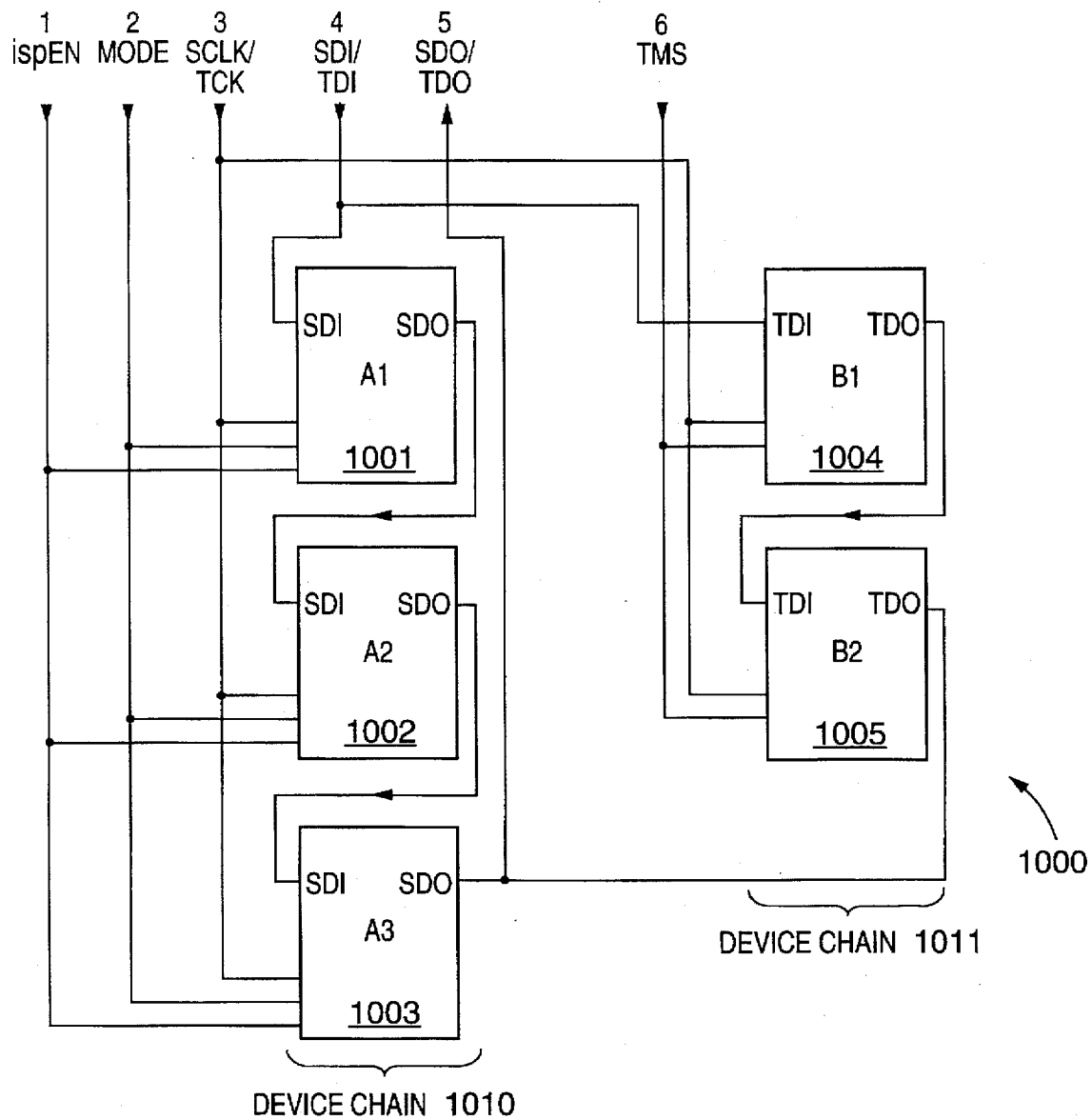
FIG. 10 further illustrates, under the ISP and BSCAN programming conventions, using an ATE tester to program system 1000 in a sequential manner, with common clock, input and output pins.

FIG. 10 illustrates further how an ATE tester can be used to program system 1000 in a sequential manner, using common clock, input and output pins, under the ISP and ESCAN programming conventions. FIG. 10 thus shows a configuration in which ISP and BSCAN device chains can be programmed on a single ATE, with a minimum number of pins. FIG. 10 shows device chain 1010, consisting of PLDs 1001–1003 of the ISP convention, and device chain 1011, consisting of PLDs 1004–1005, of the BSCAN programming convention. Device chain 1010 is configured in the conventional ISP manner, driven by ATE pins 1–5. Device chain 1011 is configured to have the TMS pins of PLDs 1004–1005 driven by ATE pin 6. The TCK pins of PLDs 1004 and 1005 receive the clock signal on ATE pin 3, thereby sharing a clock signal with PLDs 1001–1003 of device chain 1010. Further, the TDI and TDO pins of device chain 1011 are connected to ATE pins 4 and 5, in common with the SDI and SDO pins of device chain 1010.

In FIG. 10, the ISPEN pin (ATE pin 1) is first driven to logic low to put device chain 1010 into programming mode. At the same time, the SDO pin (ATE pin 5) of device chain 1010 is active and begin driving logic values. To ensure that the TDO pin of device chain 1011, which is also connected to ATE pin 5, hence SDO terminal of device chain 1010, is kept at high impedance, the TMS pins of PLDs 1004 and 1005 of device chain 1011 are kept at logic high. Similarly, the ISPEN pin (ATE pin 1) is driven high to put into a high impedance state the SDO of device chain 1010, while device chain 1011 is being programmed. In this configuration, device chains 1010 and 1011 are individually programmed in the ISP conventional manner.

Figure 11:
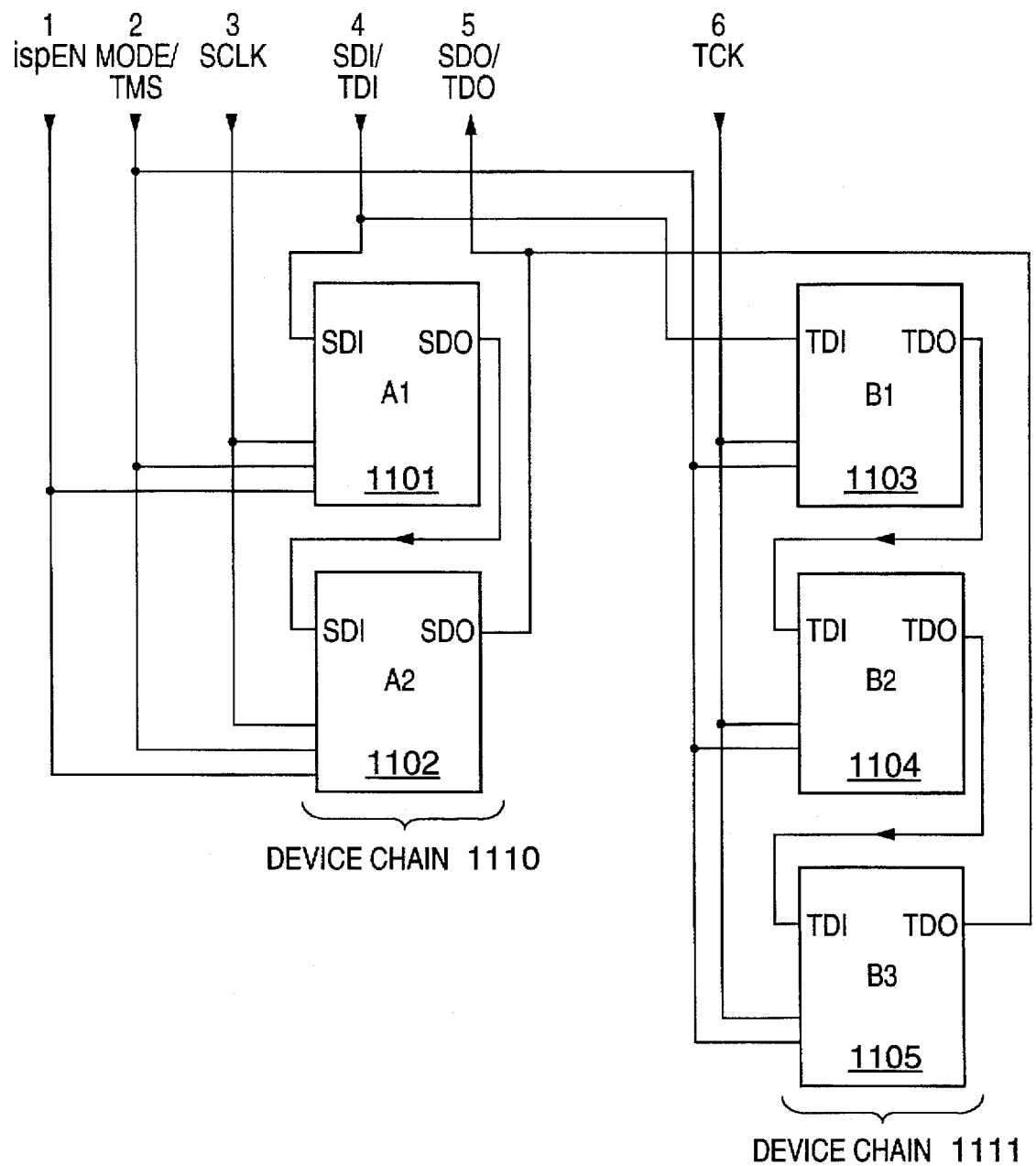
FIG. 11 shows another variation of sequential programming using the ISPEN and ESCAN programming conventions, in which device chains 1110 and 1111 share Mode, input and output pins.

FIG. 11 shows another variation of sequential programming using the ISPEN and BSCAN programming conventions, in which device chains 1110 and 1111 share using Mode, input and output pins. Device chains 1110 and 1111, formed by PLDs 1101–1102 and PLDs 1103–1105, conform to the ISPEN and BSCAN programming convention respectively. In FIG. 11, ATE pins 1–5 drive the ISPEN, Mode, SCLK, SDI and SDO pins of device chain 1110 in the conventional ISP manner, and ATE pin 2, ATE pin 4, ATE pin 5 and ATE pin 6 drive the TMS, TDI, TDO and TCK pins in the conventional BSCAN manner. Under this configuration, ATE pin 3 and ATE pin 6, i.e. SCLK and TCK pins, are active alternatively. Thus, device chains 1110 and 1111 can be programmed conventionally when their respective clock signals are active. The SDO terminal of PLD 1102 and the TDO terminal of PLD 1105 are in their high impedance states when their respective clock signals are inactive.

Figure 12:
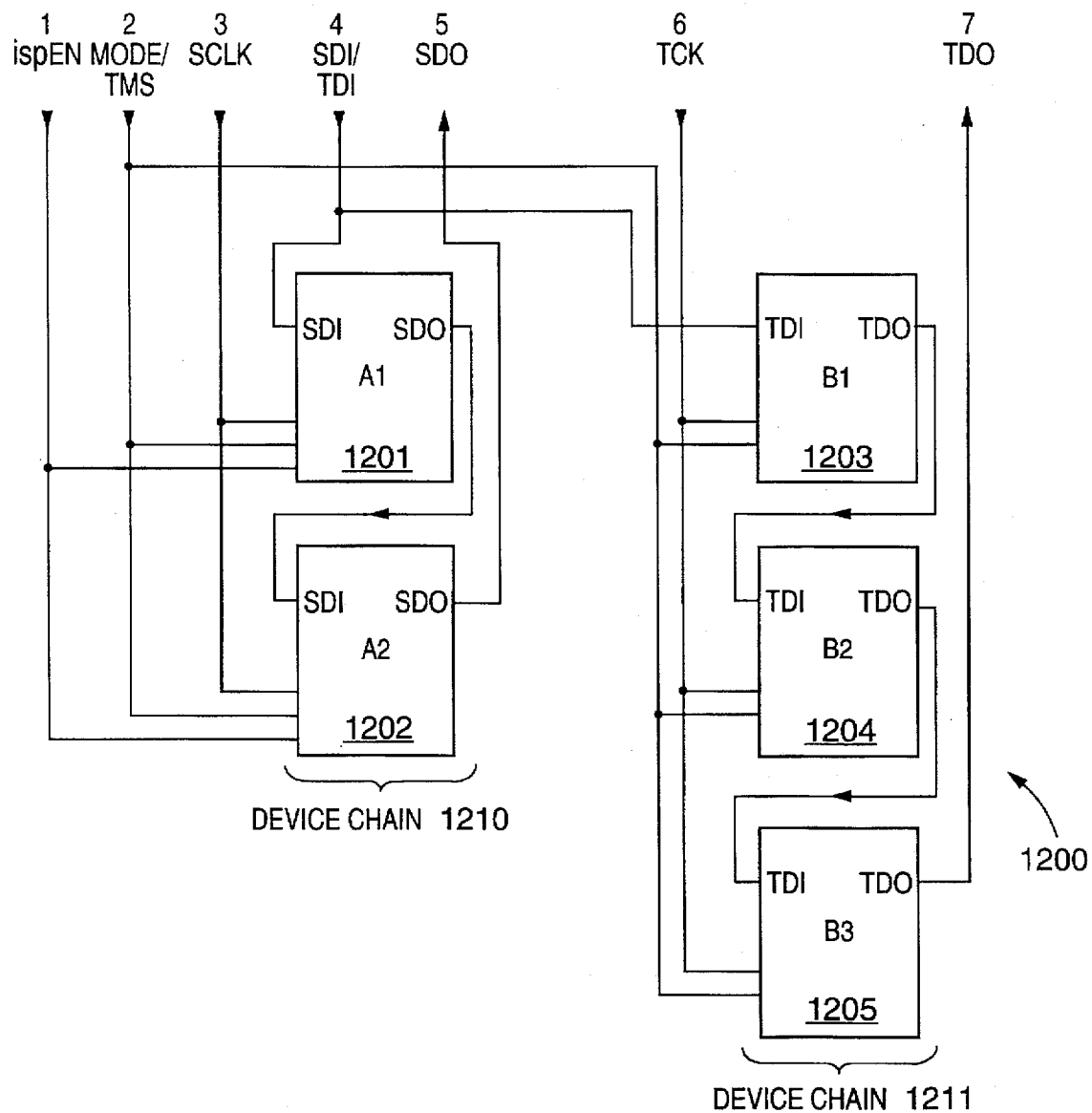
FIG. 12 shows system 1200, which allows parallel programming device chains 1210 and 1211 under the ISP and BSCAN programming conventions.

FIG. 12 shows system 1200, which allows parallel programming device chains 1210 and 1211 under the ISP and BSCAN programming conventions. System 1200 is similar to system 1100 of FIG. 11, except that the SDO pin of device chain 1210 of the ISP convention and the TDO pin of device chain 1211 of the BSCAN programming convention are not connected in common. The SDO pin of device chain 1210 need not be kept at high impedance state when the TDO pin of device chain 1211 is active, and vice versa. In system 1200, while data and instructions are shifted in and out sequentially, multiplexing ATE pin 4, programming of device chains 1210 and 1211 can be performed in parallel. In system 1200, the SCLK and TCK pins (i.e. ATE pin 4 and ATE pin 6) control when device chains 1210 and 1211 are active. ATE pin 6 and ATE pin 8, i.e. SCLK and TCK pins, are each held at logic low when the other device chain's data or instructions are being shifted into the other device chain's serial input data terminal or being shifted out at the other device chain's serial output data terminal.

Figure 13:
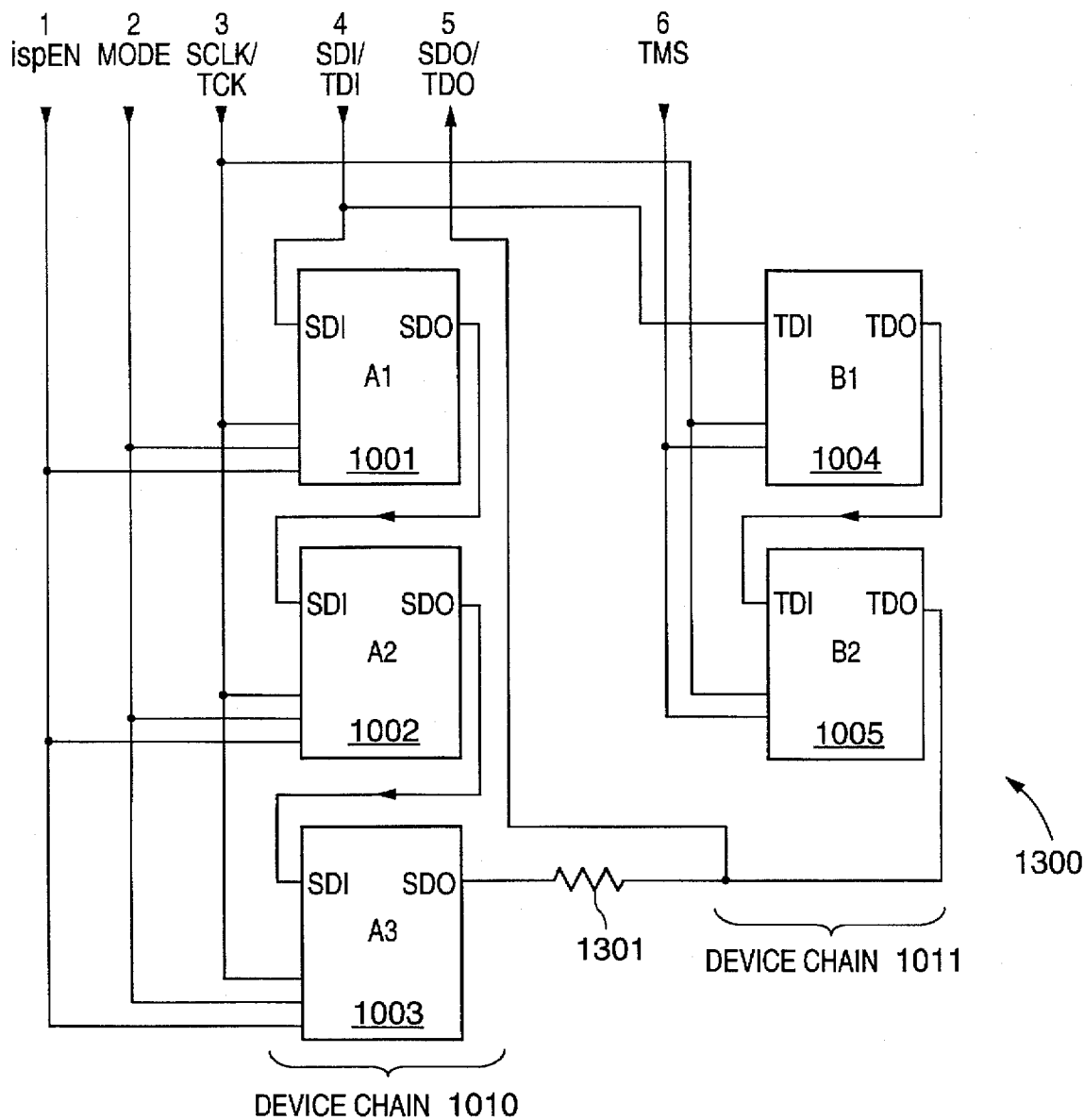
FIG. 13 shows system 1300, which is a variation of system 1000 of FIG. 10; system 1300 allows parallel programming of device chains 1010 and 1011.

FIG. 13 shows system 1300, which is a variation of system 1000 of FIG. 10; system 1300 allows parallel programming of device chains 1010 and 1011. Unlike system 1000, system 1300 is provided with a resistor 1301 coupled between PLD the SDO pin of PLD 1003 and the TDO pin of PLD 1005. As described above with respect to system 1000, instructions and data are shifted into each device chain while the other device chain is inactive, by alternatively holding inactive MODE signal at ATE pin 2 (device chain 1010) or the TMS signal at ATE pin 6 (device chain 1011). However, because of resistor 1301, the output signals at the SDO terminal of PLD 1003 and the TDO terminal of PLD 1005 can both be active during programming without interfering with each other. Thus, simultaneous programming of device chains 1010 and 1011 is possible under system 1300.

Figure 14:
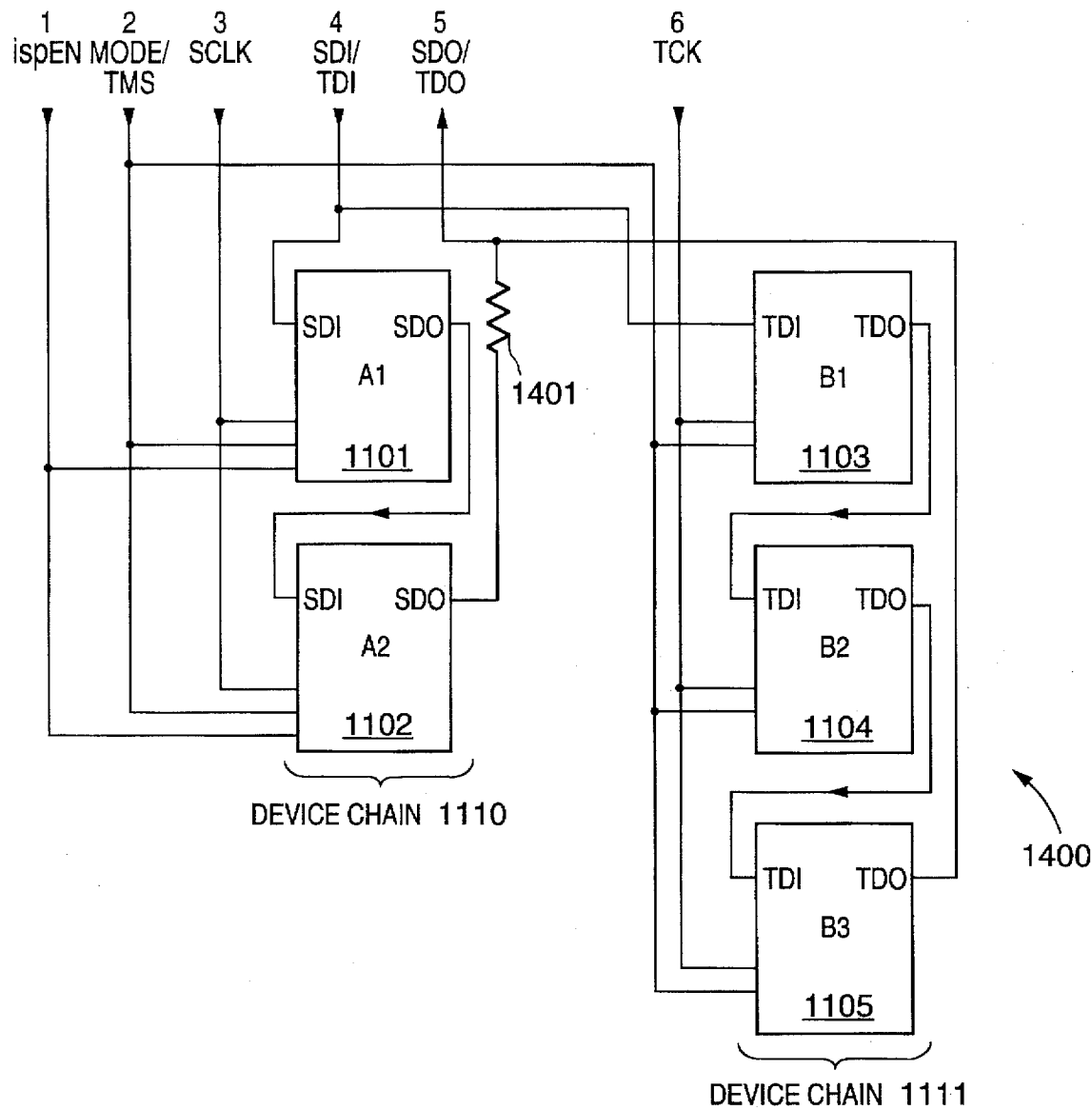
FIG. 14 shows system 1400, which is a variation of system 1100 of FIG. 11; system 1400 allows parallel programming of device chains 1110 and 1111.

FIG. 14 shows system 1400, which is a variation of system 1100 of FIG. 11; system 1400 allows parallel programming of device chains 1110 and 1111. Unlike system 1100, system 1400 is provided with a resistor 1401 coupled between the SDO pin of PLD 1102 and the TDO pin of PLD 1005. As described above with respect to system 1100, instructions and data are shifted into each device chain while the other device chain is inactive, by alternatively holding inactive the SCLK signal at ATE pin 3 (device chain 1110) or the TCK signal at ATE pin 6 (i.e. device chain 1111). However, because of resistor 1301, the output signals at the SDO terminal of PLD 1102 and the TDO terminal of PLD 1105 can both be active during programming without interfering with each other. Thus, simultaneous programming of device chains 1110 and 1111 is possible under system 1400.

The above detailed description is provided to illustrate the specific embodiments of the present invention and is not intended to be limiting. Numerous variations and modifications are possible within the scope of the present invention. The present invention is defined by the appended claims.

We claim:

1. A method for programming in parallel programmable logic devices (PLDs), using an automatic tester (ATE) of multiple pins, each programmable logic device including a control pin, an input pin and an output pin, said method comprising the steps of:

providing a first device chain of one or more serially connected PLDs, such that each input pin of said PLDs of said first device chain, except the input pin of the first PLD in said first device chain, is connected to an output pin of another PLD in said first device chain, said control pins of said PLDs in said first device chain being electrically coupled to each other and to a first pin of said ATE, said input pin of said first PLD of said first device chain being electrically coupled to a second pin of said ATE;

providing a second device chain of one or more serially connected PLDs, such that each input pin of said PLDs of said second device chain, except the input pin of the first PLD in said second device chain, is connected to an output pin of another PLD in said second device chain, said control pins of said PLDs in said PLDs of said second device chain being electrically coupled to each other and to said first pin of said ATE, said input pin of said first PLD of said second device chain being electrically coupled to a third pin of said ATE;

shifting programming instructions and data into said PLDs of said first device chain via said second pin of said ATE and said PLDs of said second device chain via said third pin of said ATE; and simultaneously programming PLDs in said first and second device chains.

2. A method as in claim 1, wherein said output pin of the last PLD in said first device chain is coupled to said input pin of said first PLD in said second device chain through a resistor.

3. A method as in claim 1, wherein said method further comprising the steps of:

providing a third device chain of one or more serially connected PLDs, such that each input pin of said PLDs of said third device chain, except the input pin of the first PLD in said third device chain, is connected to an output pin of another PLD in said third device chain, said control pins of said PLDs in said PLDs of said third device chain being electrically coupled to each other and to a fourth pin of said ATE, said input pin of said first PLD of said third device chain being electrically coupled to a fifth pin of said ATE; and providing a fourth device chain of one or more serially connected PLDs, such that each input pin of said PLDs of said fourth device chain, except the input pin of the first PLD in said fourth device chain, is connected to an output pin of another PLD in said fourth device chain, said control pins of said PLDs in said PLDs of said second device chain being electrically coupled to each other and to a sixth pin of said ATE, said input pin of said first PLD of said fourth device chain being electrically coupled to a seventh pin of said ATE; and wherein (i) said step of shifting programming instructions and data further shifts into said PLDs of said third device chain via said fifth pin of said ATE and into said PLDs of said second device chain via said seventh pin of said ATE; and (ii) said step of simultaneously programming simultaneously programs said third and fourth device chains.

4. A method as in claim 3, wherein the output pin of the last PLD in said second device chain is electrically coupled to said input pin of said first PLD of said third device chain through a resistor.

5. A method as in claim 1, wherein said first and second device chains are each programmed according to a different programming convention.

6. A method for programming in parallel programmable logic devices (PLDs), using an automatic tester (ATE) of multiple pins, each programmable logic device including a control pin, an input pin and an output pin, said method comprising the steps of:

providing a first device chain of one or more serially connected PLDs, such that each input pin of said PLDs of said first device chain, except the input pin of the first PLD in said first device chain, is connected to an output pin of another PLD in said first device chain, said control pins of said PLDs in said first device chain being electrically coupled to each other and to a first pin of said ATE, said input pin of said first PLD of said first device chain being electrically coupled to a second pin of said ATE;

providing a second device chain of one or more serially connected PLDs, such that each input pin of said PLDs of said second device chain, except the input pin of the first PLD in said second device chain, is connected to an output pin of another PLD in said second device chain, said control pins of said PLDs in said PLDs of said second device chain being electrically coupled to each other and to a third pin of said ATE, said input pin of said first PLD of said second device chain being electrically coupled to a fourth pin of said ATE;

shifting programming instructions and data into said PLDs of said first device chain via said second pin of said ATE and said PLDs of said second device chain via said fourth pin of said ATE; and simultaneously programming PLDs in said first and second device chains.

7. A method as in claim 1, wherein said output pin of the last PLD in said first device chain is coupled to said input pin of said first PLD in said second device chain through a resistor.

* * * * *